(12) United States Patent
Sinha et al.

(10) Patent No.: US 11,081,469 B2
(45) Date of Patent: Aug. 3, 2021

(54) THREE-DIMENSIONAL INTEGRATED CIRCUIT TEST AND IMPROVED THERMAL DISSIPATION

(71) Applicant: Arm Limited, Cambridge (GB)

(72) Inventors: Saurabh Pijuskumar Sinha, San Antonio, TX (US); Joel Thornton Irby, Austin, TX (US); Supreet Jeloka, Austin, TX (US)

(73) Assignee: ARM LIMITED, Cambridge (GB)

( * ) Notice: Subject to any disclaimer, the term of this patent is extended or adjusted under 35 U.S.C. 154(b) by 50 days.

(21) Appl. No.: 16/580,349

(22) Filed: Sep. 24, 2019

(65) Prior Publication Data

US 2021/0091041 A1   Mar. 25, 2021

(51) Int. Cl.
| | |
|---|---|
| *H01L 23/367* | (2006.01) |
| *H01L 25/065* | (2006.01) |
| *H01L 21/66* | (2006.01) |
| *H01L 25/00* | (2006.01) |
| *H01L 21/48* | (2006.01) |
| *H01L 23/00* | (2006.01) |

(52) U.S. Cl.
CPC ...... *H01L 25/0657* (2013.01); *H01L 21/4871* (2013.01); *H01L 22/14* (2013.01); *H01L 23/367* (2013.01); *H01L 24/08* (2013.01); *H01L 24/89* (2013.01); *H01L 25/50* (2013.01); *H01L 2224/08147* (2013.01); *H01L 2224/80001* (2013.01); *H01L 2225/06541* (2013.01); *H01L 2225/06589* (2013.01)

(58) Field of Classification Search
CPC ............. H01L 23/367; H01L 23/3675; H01L 23/4012; H01L 25/043; H01L 25/0657; H01L 25/0756; H01L 2023/405; H01L 2224/08147; H01L 2224/08148; H01L 2225/06541; H01L 2225/06558; H01L 2225/06589
See application file for complete search history.

(56) References Cited

U.S. PATENT DOCUMENTS

2019/0363129 A1\*   11/2019   Yokoyama ............. G11C 5/025

\* cited by examiner

*Primary Examiner* — Hoai V Pham
(74) *Attorney, Agent, or Firm* — Talem IP Law, LLP

(57) ABSTRACT

A three-dimensional (3D) integrated circuit (IC) can include a bottom tier with first circuitry and first backside TSVs coupled to a substrate; a top tier coupled to the first tier at a front side and having second circuitry and second backside TSVs; and a heat conductor on the second backside TSVs of the top tier. The heat conductor is coupled to the second backside TSVs to provide improved heat dissipation through the top tier. During pre-bond testing, the top tier can be tested at speed using the second backside TSVs.

8 Claims, 11 Drawing Sheets

THREE-DIMENSIONAL INTEGRATED CIRCUIT TEST AND IMPROVED THERMAL DISSIPATION

BACKGROUND

A three-dimensional (3D) integrated (IC) circuit is formed of a plurality of dies that are stacked on top of each other with package level, wafer level, or silicon level integration. One method of stacking integration involves bonding two dies together in a face-to-face configuration via bond pads on their top metal layers and then bonding the die at the bottom tier of the stack to a substrate via pads or bumps on through silicon vias (TSVs) on the backside of the bottom tier die. Another method of stacking integration involves bonding two dies together in a face-to-back configuration where TSVs of the bottom tier die are bonded via pads or bumps on back redistribution layer routing to pads/bumps on the top metal layer of the tier above and then bonding the die at the bottom tier of the stack to a substrate via pads or bumps on the top metal of the bottom tier die.

A 3D IC can show improved yield due to the ability to test each die separately and discarding only the dies that contain a fault instead of the entire system. This testing of the tiers separately occurs during pre-bond testing. Pre-bond testing allows a manufacturer to check for defects or other issues such as operating speeds. During pre-bond testing, signals are applied to the device under test via a probe coupled from automated test equipment. These probes can be coupled to various entry points into the wafers. Entry points can include, for instance, bumps connected to the TSVs and pre-bond pads.

BRIEF SUMMARY

3D IC test and improved thermal dissipation are provided. TSVs are placed across an entire design for each die instead of just a bottom tier die and are used for pre-bond testing of each die in the stack. The TSVs of the top tier are then used post-bonding to improve thermal dissipation of the 3D IC.

A 3D IC that supports the described pre-bond testing can include a bottom tier having first circuitry and first backside TSVs, where the first backside TSVs are coupled to a substrate. A top tier of the 3D IC has second circuitry and second backside TSVs, and is coupled to the first tier at a front side. Advantageously, the 3D IC can include a heat conductor on the second backside TSVs of the top tier, providing improved heat dissipation through the top tier after manufacturing. The heat conductor can be formed from a passivation material layer, a thermal interface material layer, and a heat spreader.

A method of manufacturing a 3D IC can include coupling each tier of the 3D IC together into a stack after pre-bond testing the tiers of the 3D IC, where both a bottom tier and a top tier of the 3D IC each include backside TSVs, which are used during pre-bond testing. A heat conductor can be applied on the top tier of the stack, using the backside TSVs of the top tier to support improved heat dissipation. The bottom tier of the stack can be coupled to a substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

3D IC test and improved thermal dissipation are provided. TSVs are placed across an entire design for each die instead of just a bottom tier die and are used for pre-bond testing of each die in the stack. The TSVs of the top tier are then used post-bonding to improve thermal dissipation of the 3D IC.

As previously mentioned, in the process of pre-bond testing, each tier of a 3D IC can be tested independently. In some cases, the dies used for the different tiers are manufactured and/or tested at different fabrication plants.

Figure 1A:
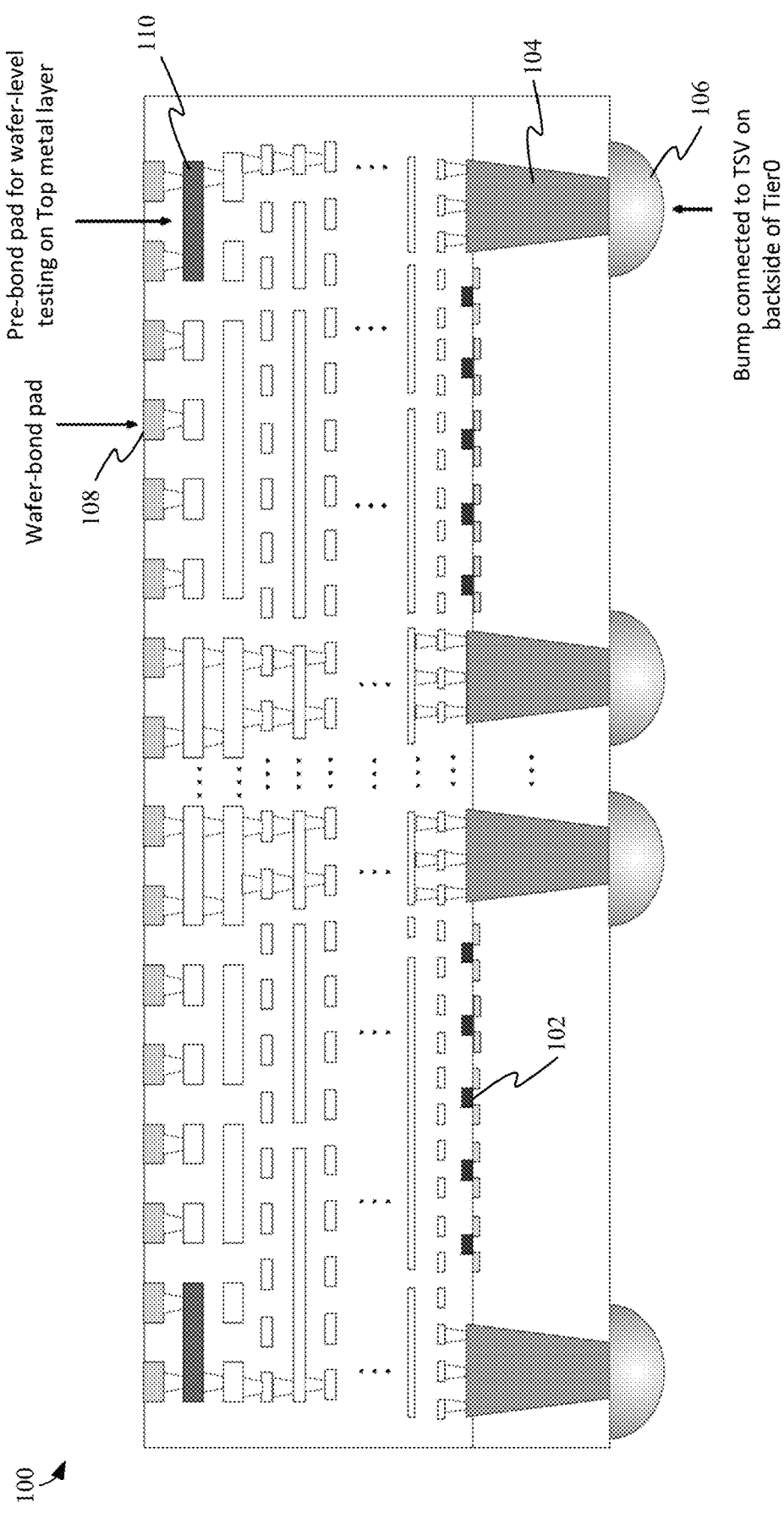
FIGS. 1A-1E illustrate a current implementation for a 3D IC.

FIGS. 1A-1E illustrate a current implementation for a 3D IC. Referring to FIG. 1A, a simplified cross-section of a die that can be a bottom tier of a 3D IC is shown. The bottom tier die 100 can include transistors 102 to provide various functionality as required by a circuit of the 3D IC that is implemented on the bottom tier die 100. The bottom tier die 100 can include TSVs 104 to allow for interaction with the bottom tier die 100, including signal paths and power supply from, for example, a substrate (not shown). Bumps 106 can allow for better access and bonding of the substrate (not shown) to the TSVs 104. The bottom tier die 100 can also include, at its front side, wafer bond pads 108 for coupling/bonding to other tiers of the 3D IC. In some cases, the bottom tier die 100 also includes pre-bond pads 110 to allow for wafer-level testing on the top metal layer.

Figure 1B:
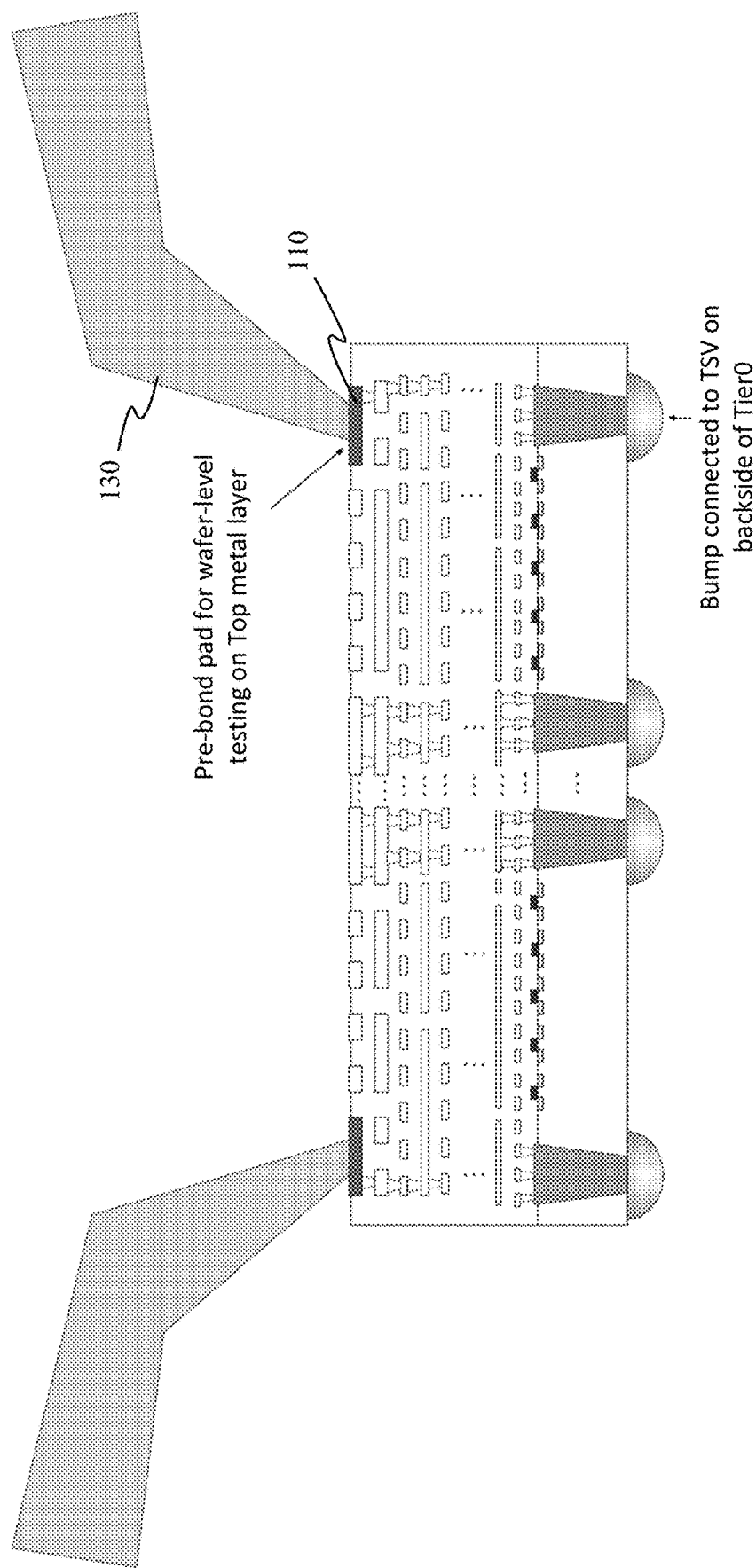
Figure 1C:
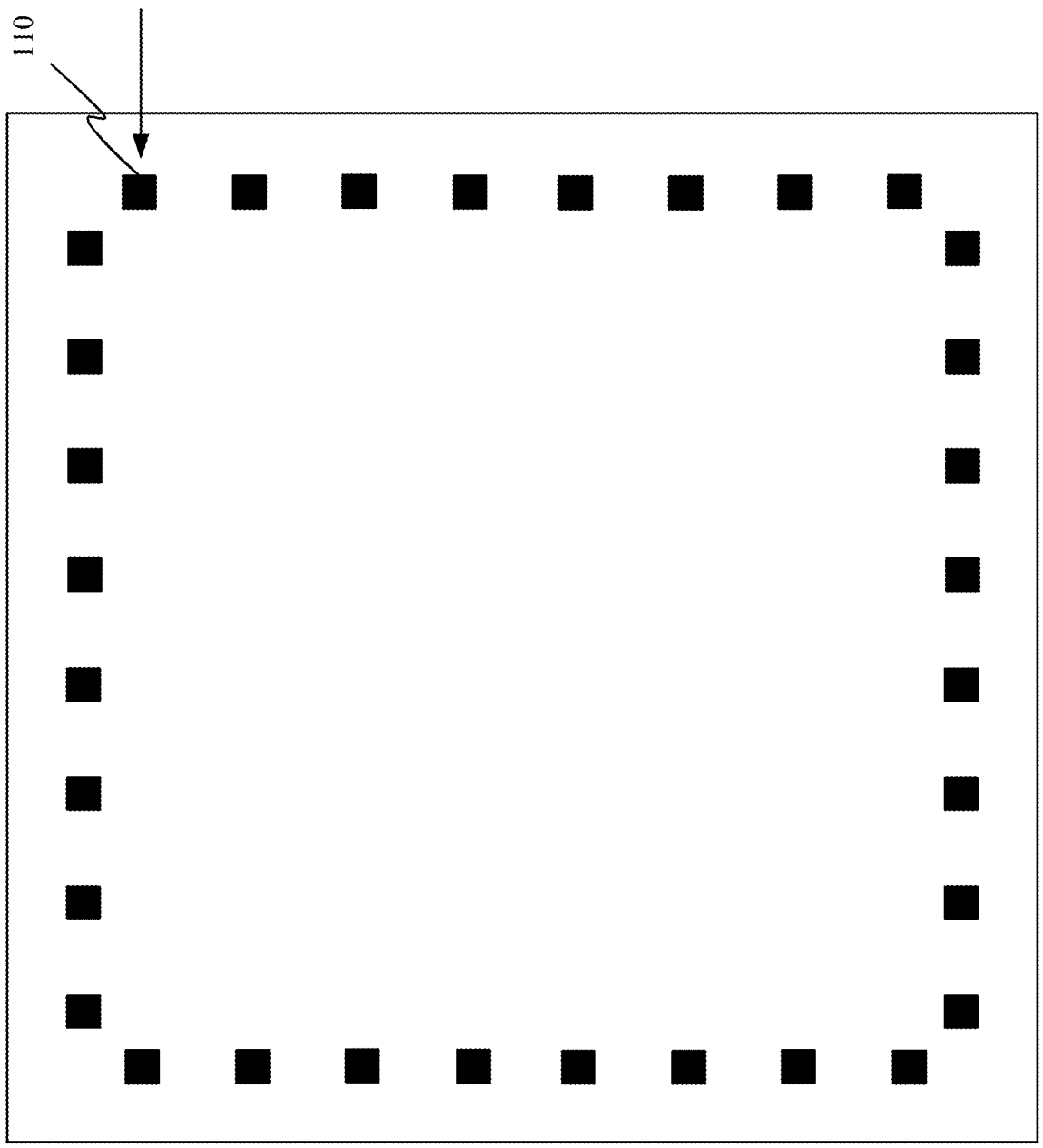

For example, as shown in FIG. 1B, during pre-bond testing, probes 130 of an automated test equipment can introduce power or test signals into the die (e.g., by contacting the pre-bond pads 110 of FIG. 1A) to measure a response. Pre-bond pads 110 are often only at the periphery of the top layer so as to avoid blocking the 3D connection interface, as shown in FIG. 1C. Referring to FIG. 1C, an arrangement of pre-bond pads can be seen at the periphery of the front side of a die. The pre-bond pads 110 are often not evenly distributed across the top of the die, but rather grouped at the periphery of the die surface. The lack of pre-bond pads 110 throughout the front side of the die 100 can cause issues in testing the die, particularly when circuits or circuit elements in the center of the chip are to be powered or measured. As will be described herein, a 3D IC test is provided in which it is possible to have improved testing coverage—including being able to power and measure elements in the center of the chip.

Figure 1D:
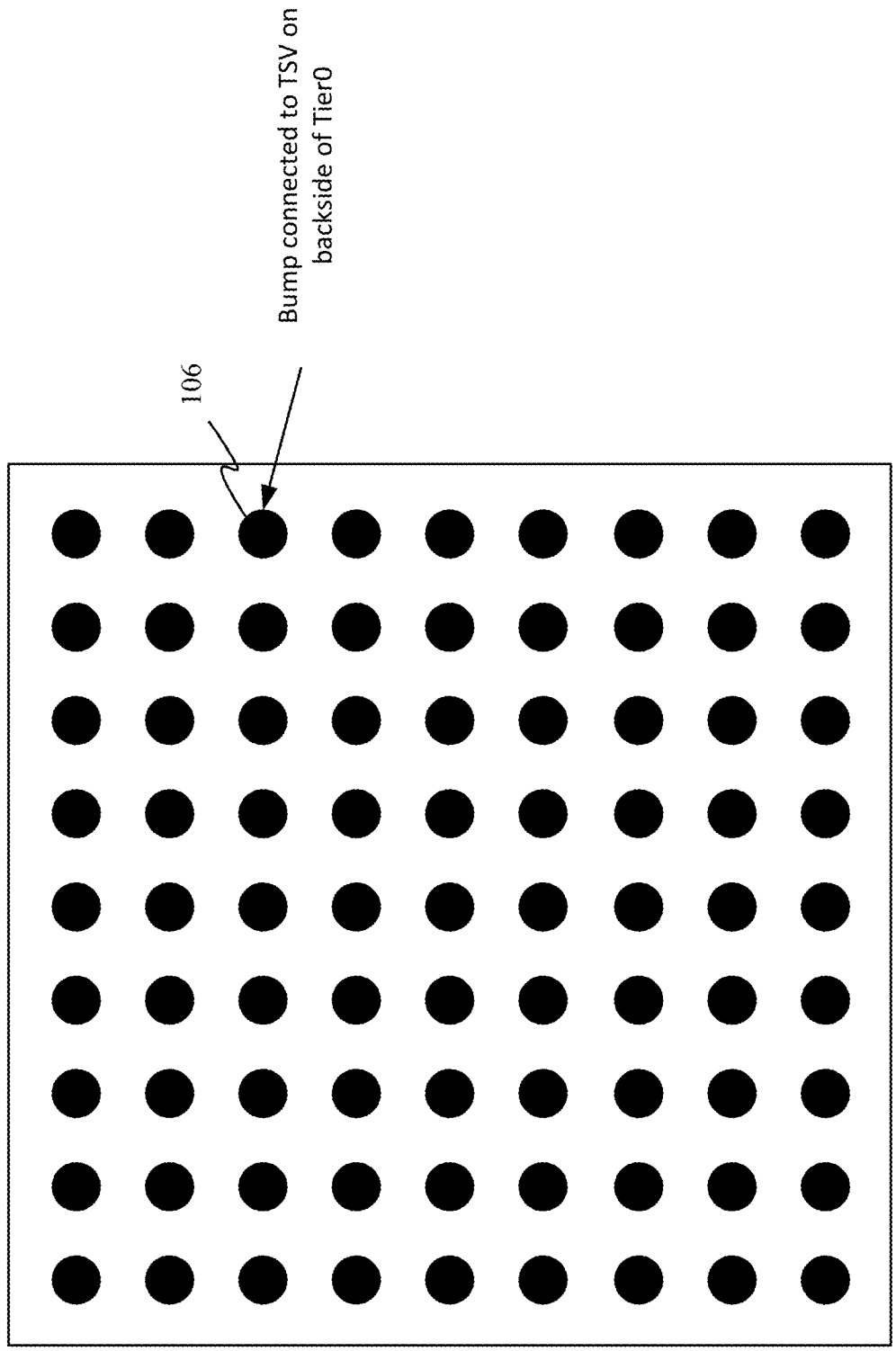

Conventionally, testing may also be carried out on the TSVs 104 to ensure that the TSVs 104 do not include faults. Referring to FIG. 1D, an arrangement of bumps can be seen to visualize the spacing of TSVs on the back side of a die. The bumps 106, as in FIG. 1A, are connected to TSVs 104 to allow for easy access in the system. TSVs are often evenly distributed across the entire die surface, which allows for easier distribution. As will be described herein, the distribution of TSVs can be used during pre-bond testing, due to an easier delivery of power throughout the chip, including to the center of the chip.

Figure 1E:
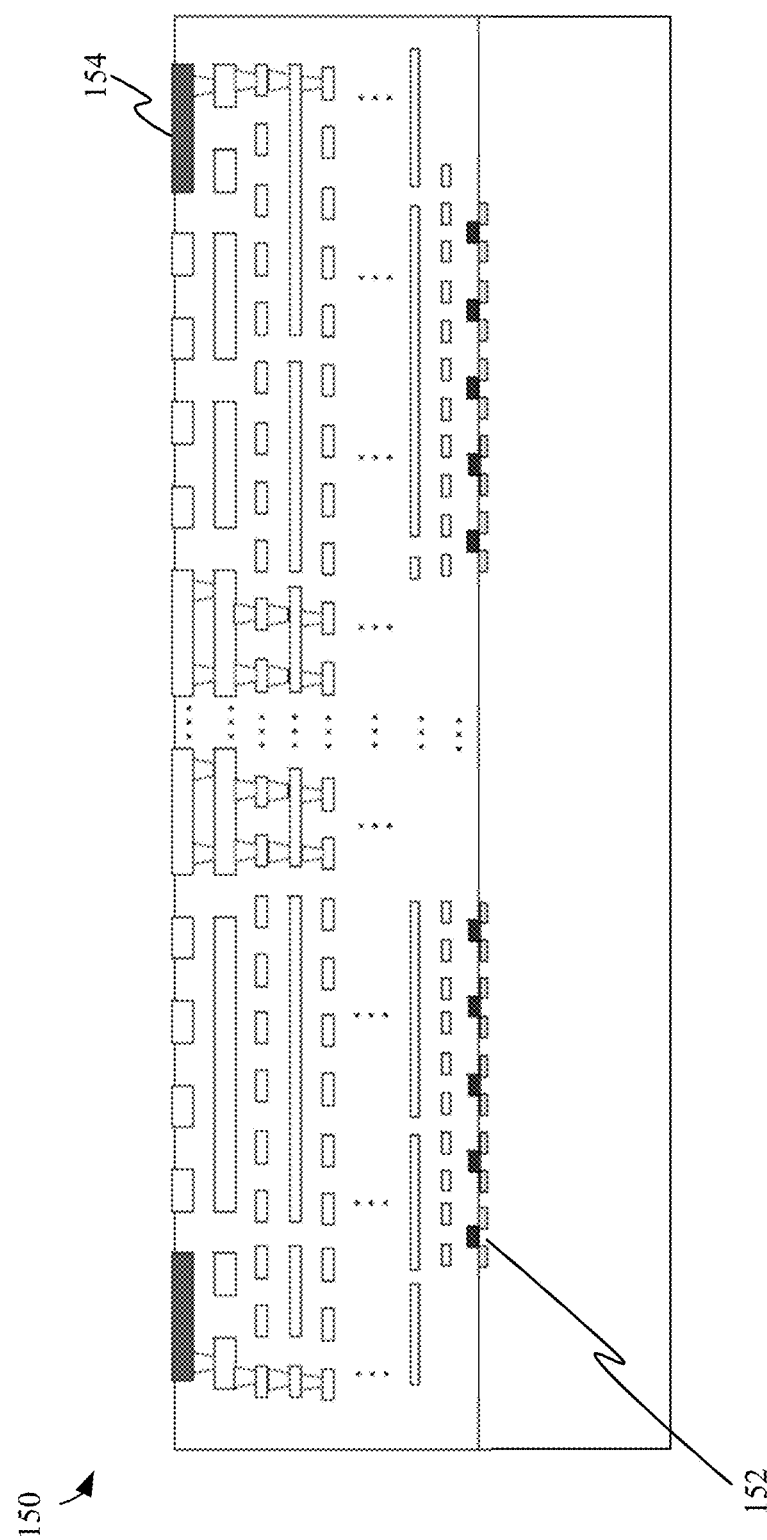

Referring to FIG. 1E, a simplified cross-section of a die that can be a top tier of a conventional 3D IC is shown. The top tier die 150 can include transistors 152 forming the circuit fabricated on that die and pre-bond pads 154 on the top metal layer at the periphery of the circuit, as shown in FIG. 1C. As can be seen, the conventional top tier die 150 does not include the TSVs 104 and the associated bumps 106 formed on the bottom tier die 100 since, once part of the 3D IC, the signals and power are provided to the top tier die 150 from the lower tiers and substrate and it is difficult to provide power on two planes (and signals and power are unlikely to be propagated above the top tier). As previously mentioned, testing of the circuit on the conventional die is carried out via the pre-bond pads 154 on the top metal layer, as shown in FIG. 1C with respect to pre-bond pads 110. After pre-bond testing, wafer bond pads, similar to the wafer bond pads 108 of the bottom tier die 100 may be added for coupling front-to-front with another die (e.g., bottom tier 100).

According to certain implementations of the described 3D IC test and improved thermal dissipation, instead of forming top tiers without TSVs such as described with respect to the conventional top tier die 150, top tier dies are formed with TSVs and the TSVs are used for pre-bond testing. In this manner, during pre-bond testing, because the TSVs can be arranged across the entire design (unlike the boundary/periphery restricted pre-bond pads), the pre-bond testing can be performed at-speed by using the TSVs. In some cases, the backside TSVs on each tier are arranged in an array covering at least a portion of the chip design. In some cases, backside TSVs are also included along the periphery of the chip design. For the 3D IC test, all tiers can be tested using the TSVs during pre-bond testing. Then, once the 3D IC is formed, the TSVs of the top tier are used to improve thermal dissipation of the 3D IC.

Figure 2:
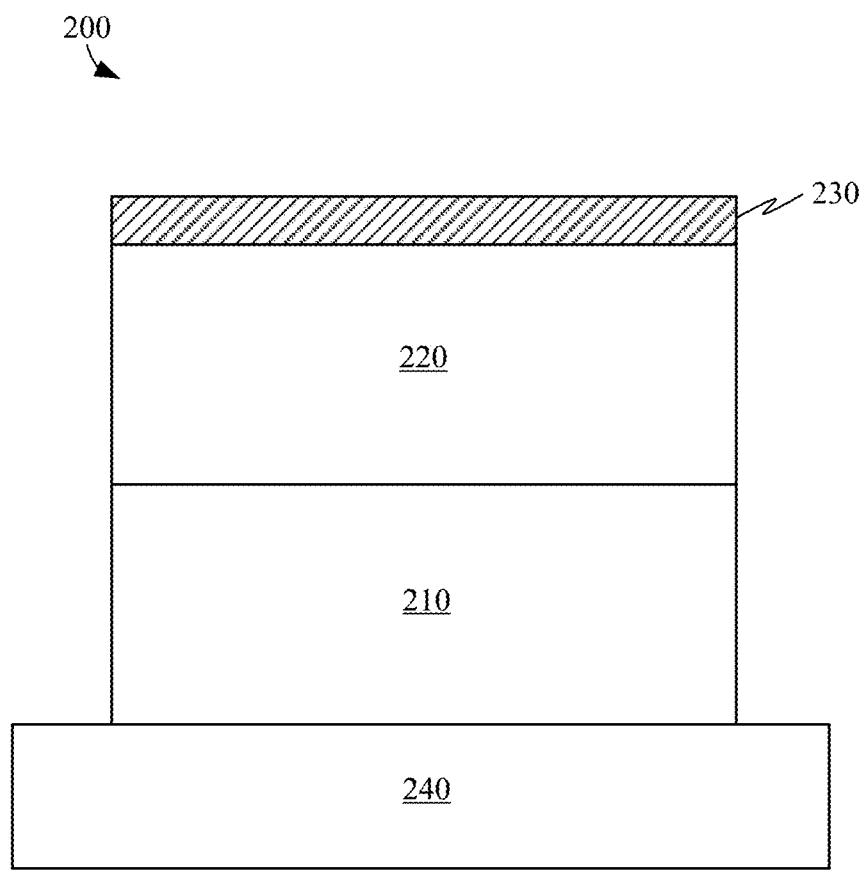
FIG. 2 illustrates an example 3D IC with improved testing capabilities and thermal dissipation.

FIG. 2 illustrates an example 3D IC with improved testing capabilities and thermal dissipation. Referring to FIG. 2, a 3D IC 200 with improved testing capabilities and thermal dissipation can include a bottom tier die 210, a top tier die 220, and a heat conductor 230 on a substrate 240. The bottom tier die 210 can include circuitry and backside TSVs, where the backside TSVs are coupled to the substrate 240. For example, in some cases, bottom tier die 210 can be implemented as illustrated with respect to bottom tier die 300 of FIG. 3A. The top tier die 220 is coupled to the bottom tier die front-to-front and also includes circuitry and backside TSVs. For example, in some cases, top tier die 220 can be implemented as illustrated with respect to top tier die 350 of FIG. 3A. The heat conductor 230 can be applied to the top tier die 220 such that the combination of the backside TSVs of the top tier die 220 and the heat conductor 230 provide improved heat dissipation through the top tier die 220. The bottom tier die 210 can be coupled to the substrate 240. The substrate 240 can function as a system interface, which can serve as a link to a larger system. The substrate can be a package substrate, a board, such as printed circuit board (PCB), an interposer (such as silicon interposer), organic interposer or redistribution layer (RDL).

Figure 3A:
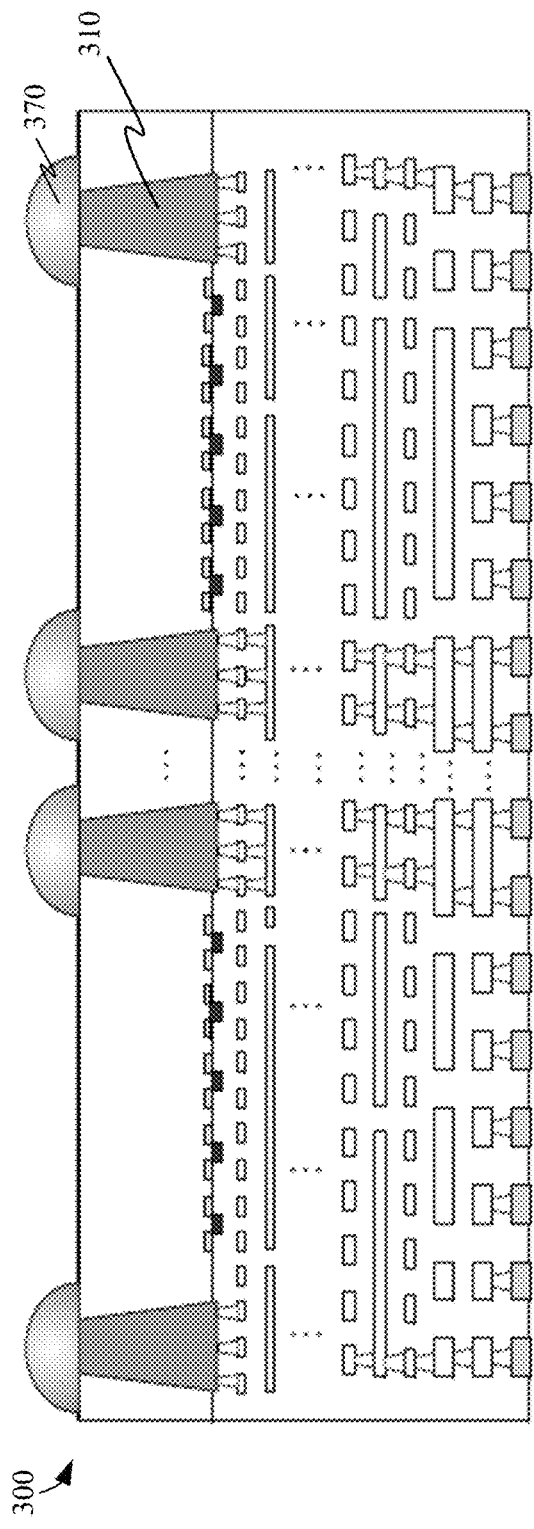
FIGS. 3A-3C illustrate an example implementation of dies for a 3D IC.
Figure 3B:
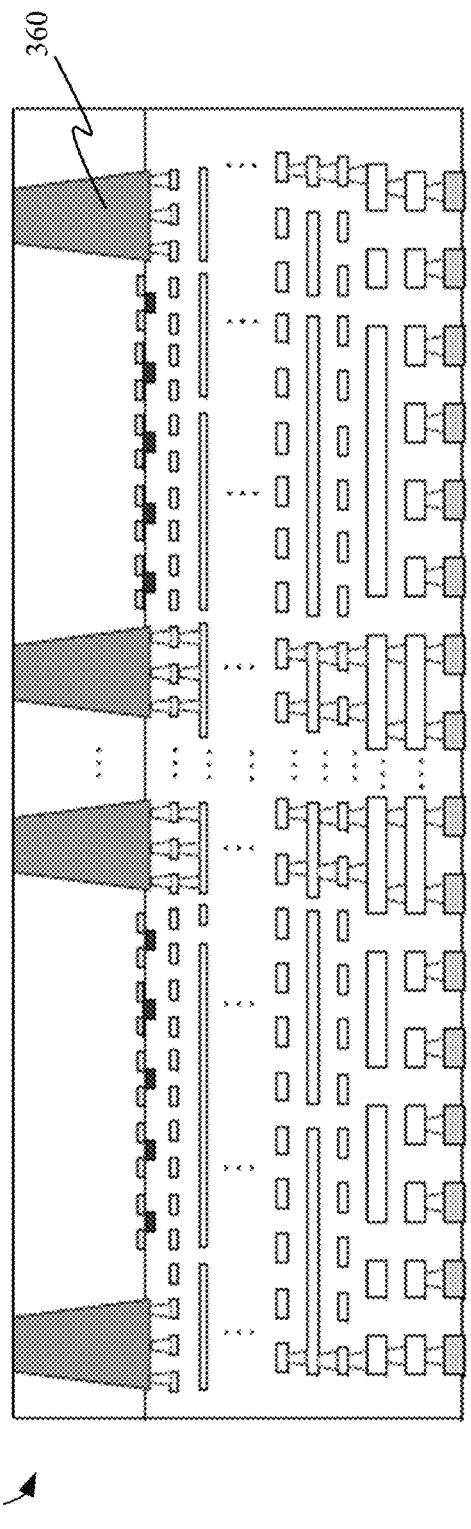
Figure 3C:
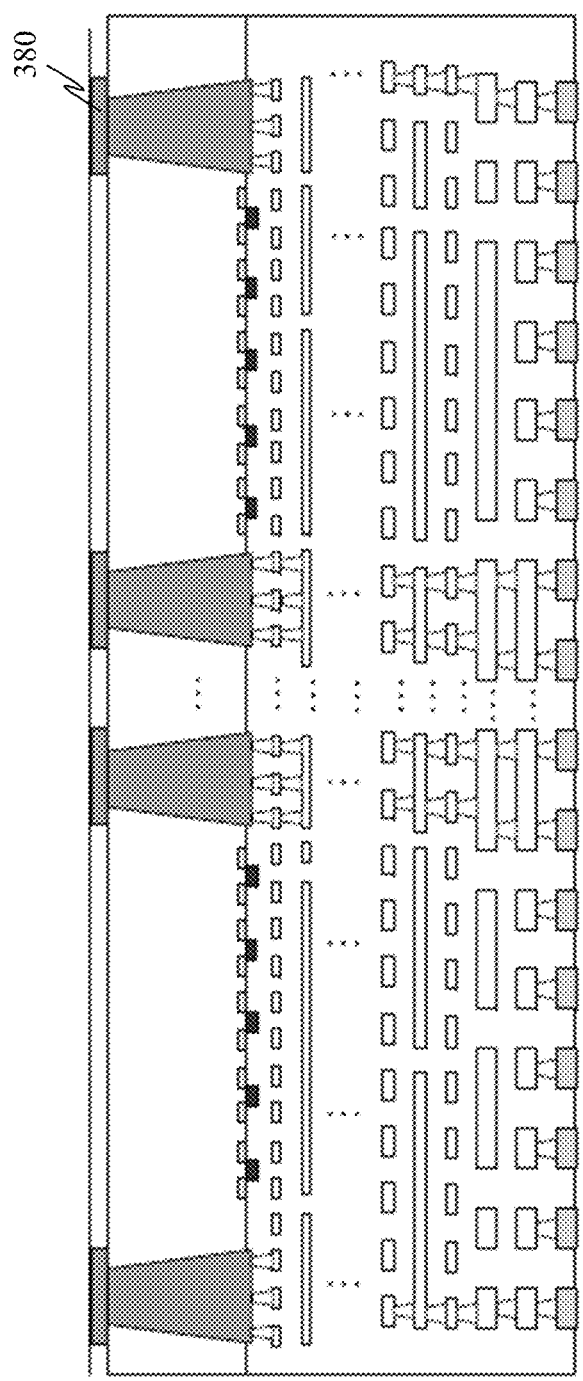

FIGS. 3A-3C illustrate an example implementation of dies for a 3D IC. As can be seen in FIGS. 3A and 3B, both the bottom tier die 300 has TSVs 310 and the top tier die 350 has TSVs 360. and top tier die 202 may be implemented as illustrated with respect to top tier die 350 of FIG. 3B. In some cases, with reference to FIGS. 3A and 3C, the bumps 370 on the TSVs 310 may instead be in the form of pads 380.

Figure 4A:
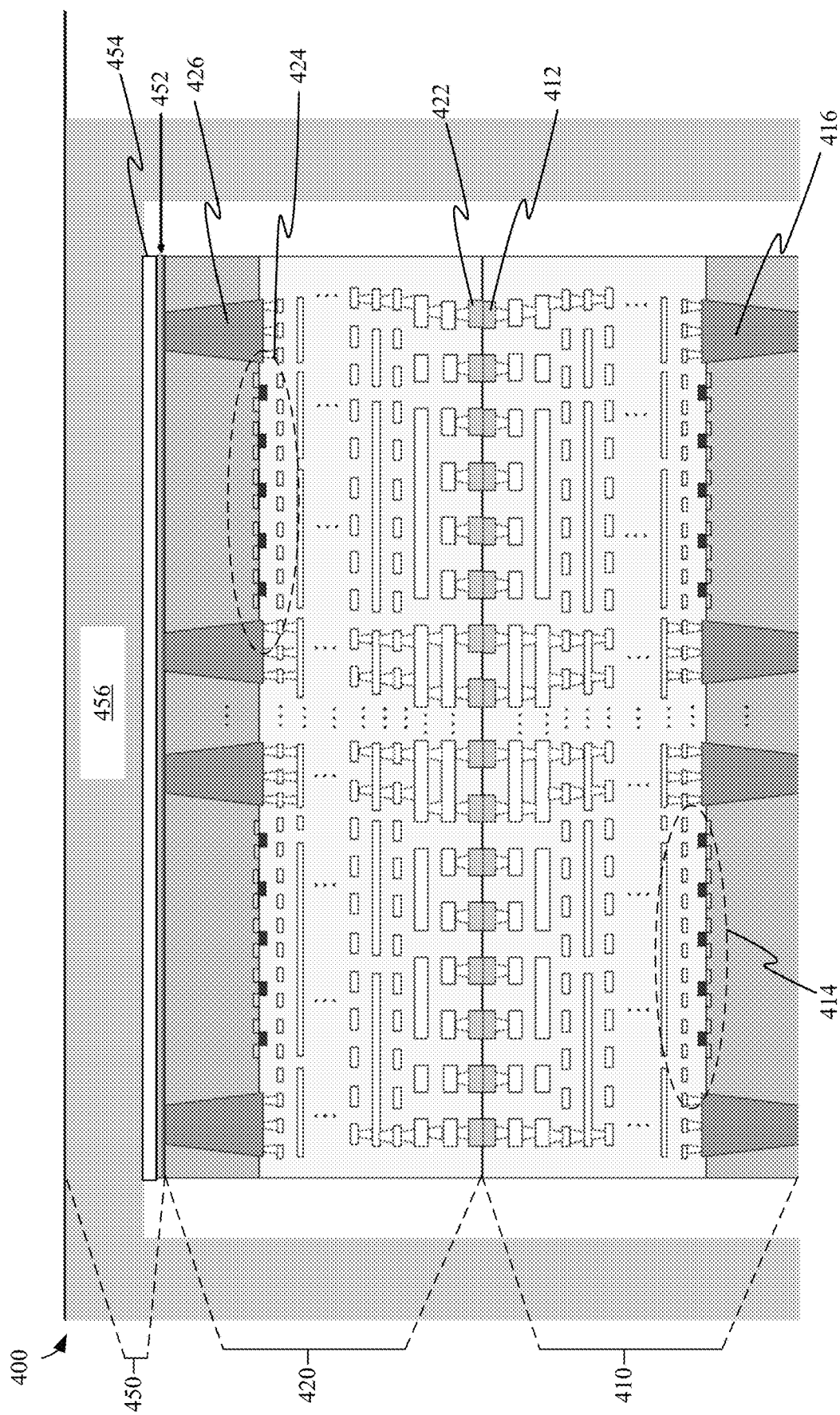
FIGS. 4A and 4B illustrate an example implementation of a 3D IC with a heat conductor.
Figure 4B:
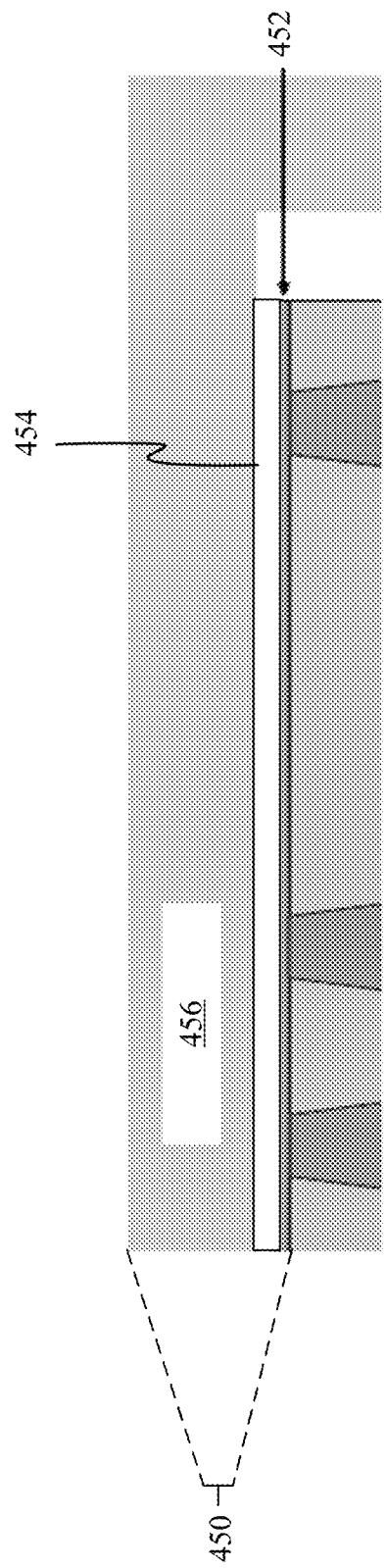

FIGS. 4A and 4B illustrate an example implementation of a 3D IC with a heat conductor. Referring to FIG. 4B, a two tier stack for a 3D IC 400 can include a bottom tier 410 and a top tier 420 that are coupled together front-to-front, for example via front-side bonding pads 412 and 422, respectively. The bottom tier 410 can be coupled to a substrate (not shown). As has been described, both the bottom tier 410 and the top tier 420 include circuitry and backside TSVs. For example bottom tier 410 includes first circuitry 414 and first backside TSVs 416 and top tier 420 includes second circuitry 424 and second backside TSVs 426. The 3D IC 400 further includes a heat conductor 450. The heat conductor 450 uses the TSVs 426 of the top tier 420 to provide a conduit for heat to travel from the 3D IC. In some cases, the heat conductor 450 can be formed from a passivation material layer 452, a thermal interface material layer 454, and a heat spreader 456. FIG. 4B shows a detail view of heat conductor 450.

Passivation material layer 452 can include materials that can protect against shorts between connections due to the TSVs on the top tier. In some cases, the passivation material layer 452 is a dielectric material. In some cases, passivation material layer 452 is a metal oxide or metal nitride. Thermal interface material layer 454 can include materials that increase thermal coupling. In some cases, the thermal interface material layer 454 is a thermal adhesive or a thermal grease. Heat spreaders 456 can transfer heat away from a system and can include any suitable conductive material.

Figure 5:
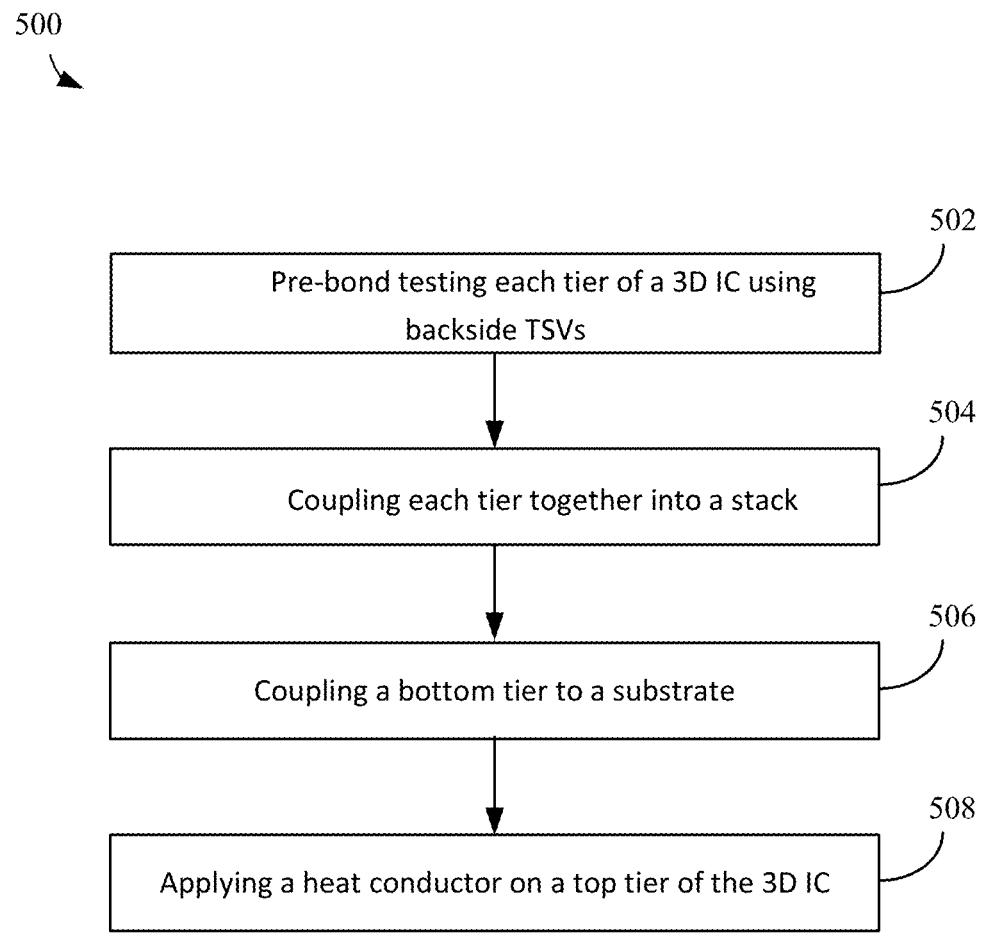
FIG. 5 illustrates a method for manufacturing a 3D IC with improved testing capabilities and thermal dissipation.

FIG. 5 illustrates a method for manufacturing a 3D IC with improved testing capabilities and thermal dissipation. All wafers used for the described 3D ICs can undergo back end of line processing in which TSVs are formed for all dies. As mentioned above, the backside TSVs on each tier are arranged in an array covering at least a portion of the chip design. For example, the backside TSVs for each tier can be arranged such as illustrated in FIG. 1D. Accordingly, the method 500 can include pre-bond testing (502) of each tier of the 3D IC using the backside TSVs. During the pre-bond testing, a testing probe of the automated testing equipment is coupled to the backside of each tier. In some cases, a method of pre-bond testing a 3D IC with at least two tiers can include testing a top tier of the 3D IC at speed using TSVs on the backside of the tip tier. In some cases, the method of pre-bond testing can further include testing a bottom tier of the 3D IC using TSVs on the backside of the bottom tier.

Dies that have passed testing can then be brought together and the method can continue by coupling (504) each tier together into a stack. For example, with reference to FIG. 4A, bonding pads 412, 422 of the different tiers can be joined or otherwise coupled such that the different tiers are interconnected vertically. Any suitable process may be carried out including bonding. After the stack is formed, the bottom tier can be coupled (506) to a substrate. For example, TSVs of the bottom tier are coupled to bumps for external I/O (input/output) connections and the bumps used to bond the bottom tier to the substrate. A heat conductor can be applied (508) on the top tier of the 3D IC. For example, a passivation material can be formed on the backside TSVs of the top tier, a thermal interface material can be formed on the passivation material, and a heat spreader can be formed on the thermal interface material. The passivation material, thermal interface material, and heat spreader can be applied in separate steps, or all at once. The heat conductor can be applied in any suitable manner, including, but not limited to, being grown, deposited, sputtered, or adhered.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A three-dimensional (3D) integrated circuit (IC) comprising:
   a bottom tier comprising first circuitry and first backside TSVs coupled to a substrate;
   a top tier coupled to the first tier at a front side, the top tier comprising second circuitry and second backside TSVs; and
   a heat conductor on the second backside TSVs of the top tier.

2. The 3D IC of claim 1, wherein the second backside TSVs are arranged in an array covering at least a portion of the second circuitry of the top tier.

3. The 3D IC of claim 1, wherein the heat conductor comprises a passivation material layer on the second backside TSVs, a thermal interface material on the passivation material layer, and a heat spreader on the thermal interface material.

4. The 3D IC of claim 1, wherein the substrate is a package substrate.

5. The 3D IC of claim 1, wherein the substrate is a board.

6. The 3D IC of claim 1, wherein the substrate is an organic substrate.

7. The 3D IC of claim 1, wherein the substrate is an interposer.

8. The 3D IC of claim 1, wherein the substrate is a system interface.

* * * * *